United States Patent [19]

Gillery

[11] Patent Number: 4,610,771
[45] Date of Patent: Sep. 9, 1986

[54] SPUTTERED FILMS OF METAL ALLOY OXIDES AND METHOD OF PREPARATION THEREOF

[75] Inventor: F. Howard Gillery, Allison Park, Pa.

[73] Assignee: PPG Industries, Inc., Pittsburgh, Pa.

[21] Appl. No.: 665,680

[22] Filed: Oct. 29, 1984

[51] Int. Cl.$^4$ .................. C23C 14/08; C23C 14/34
[52] U.S. Cl. .................. 204/192.1; 204/192.27
[58] Field of Search .......... 204/192 C, 192 SP, 192 P, 204/192 S

[56] References Cited

U.S. PATENT DOCUMENTS

| | | | |
|---|---|---|---|
| Re. 27,473 | 9/1972 | Mauer | 358/2 |
| 3,530,055 | 9/1970 | Maissel et al. | 204/192 C |
| 4,094,763 | 6/1978 | Gillery et al. | 204/192 P |
| 4,113,599 | 9/1978 | Gillery | 204/192 P |
| 4,166,018 | 8/1979 | Chapin | 204/192 R |
| 4,201,649 | 5/1980 | Gillery | 204/192 P |
| 4,327,967 | 5/1982 | Groth | 350/258 |
| 4,349,425 | 9/1982 | Miyake et al. | 204/192 P |
| 4,462,883 | 7/1984 | Hart | 204/192 C |
| 4,548,691 | 10/1985 | Dietrich et al. | 204/192 P |

FOREIGN PATENT DOCUMENTS

| | | | |
|---|---|---|---|
| 2750500 | 5/1979 | Fed. Rep. of Germany | 204/192 P |
| 2097428 | 11/1982 | United Kingdom | 204/192 C |

*Primary Examiner*—Howard S. Williams
*Attorney, Agent, or Firm*—Donna L. Seidel

[57] ABSTRACT

A metal alloy oxide film and sputtering method for its production are disclosed, as well as a high transmittance, low emissivity coated product employing said metal alloy oxide film as an antireflective film in combination with a metallic film such as silver.

20 Claims, No Drawings

SPUTTERED FILMS OF METAL ALLOY OXIDES AND METHOD OF PREPARATION THEREOF

BACKGROUND OF THE INVENTION

The present invention relates generally to the art of cathode sputtering of metal oxide films, and more particularly to the art of magnetic sputtering of multiple layer films of metal and metal oxide.

U.S. Pat. No. 4,094,763 to Gillery et al discloses producing transparent, electroconductive articles by cathode sputtering metals such as tin and indium onto refractory substrates such as glass at a temperature above 400° F. in a low pressure atmosphere containing a controlled amount of oxygen.

U.S. Pat. No. 4,113,599 to Gillery teaches a cathode sputtering technique for the reactive deposition of indium oxide in which the flow rate of oxygen is adjusted to maintain a constant discharge current while the flow rate of argon is adjusted to maintain a constant pressure in the sputtering chamber.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface.

U.S. Pat. No. 4,201,649 to Gillery discloses a method for making low resistance indium oxide thin films by first depositing a very thin primer layer of indium oxide at low temperature before heating the substrate to deposit the major thickness of the conductive layer of indium oxide by cathode sputtering at typically high cathode sputtering temperatures.

U.S. Pat. No. 4,327,967 to Groth discloses a heat-reflecting panel having a neutral-color outer appearance comprising a glass pane, an interference film having a refractive index greater than 2 on the glass surface, a heat reflecting gold film over the interference film and a neutralization film of chromium, iron, nickel, titanium or alloys thereof over the gold film.

U.S. Pat. No. 4,349,425 to Miyake et al discloses d-c reactive sputtering of cadmium-tin alloys in argon-oxygen mixtures to form cadmium-tin oxide films having low electrical resistivity and high optical transparency.

U.S. Pat. No. 4,462,883 to Hart discloses a low emissivity coating produced by cathode sputtering a layer of silver, a small amount of metal other than silver, and an anti-reflection layer of metal oxide onto a transparent substrate such as glass. The anti-reflection layer may be tin oxide, titanium oxide, zinc oxide, indium oxide, bismuth oxide or zirconium oxide.

U.S. Pat. No. Re. 27,473 to Mauer discloses a multilayer transparent article comprising a thin layer of gold or copper sandwiched between two layers of transparent material such as various metals, titanium oxide, lead oxide or bismuth oxide.

In the interest of improving the energy efficiency of double-glazed window units, it is desirable to provide a coating on one of the glass surfaces which increases the insulating capability of the unit by reducing radiative heat transfer. The coating therefore must have a low emissivity in the infrared wavelength range of the radiation spectrum. For practical reasons, the coating must have a high transmittance in the visible wavelength range. For aesthetic reasons, the coating should have a low luminous reflectance and preferably be essentially colorless.

High transmittance, low emissivity coatings as described above generally comprise a thin metallic layer, for infrared reflectance and low emissivity, sandwiched between dielectric layers of metal oxides to reduce the visible reflectance. These multiple layer films are typically produced by cathode sputtering, especially magnetron sputtering. The metallic layer may be gold or copper, but is generally silver. The metal oxide layers described in the prior art include tin oxide, indium oxide, titanium oxide, bismuth oxide, zinc oxide, zirconium oxide and lead oxide. In some cases, these oxides incorporate small amounts of other metals, such as manganese in bismuth oxide, indium in tin oxide and vice versa, to overcome certain disadvantages such as poor durability or marginal emissivity. However, all of these metal oxides have some deficiency.

Although the coating may be maintained on an interior surface of a double-glazed window unit in use, where it is protected from the elements and environmental agents which would cause its deterioration, a durable effective coating able to withstand handling, packaging, washing and other fabrication processes encountered between manufacture and installation is particularly desirable. These properties are sought in the metal oxide. However, in addition to hardness which provides mechanical durability, inertness which provides chemical durability, and good adhesion to both the glass and the metal layer, the metal oxide should have the following properties as well.

The metal oxide must have a reasonably high refractive index, preferably greater than 2.0, to reduce the reflection of the metallic layer and thus enhance the transmittance of the coated product. The metal oxide must also have minimal absorption to maximize the transmittance of the coated product. For commercial reasons, the metal oxide should be reasonably priced, have a relatively fast deposition rate by magnetron sputtering, and be nontoxic.

Perhaps the most important, and most difficult to satisfy, requirements of the metal oxide film relate to its interaction with the metallic film. The metal oxide film must have low porosity, to protect the underlying metallic film from external agents, and low diffusivity for the metal to maintain the integrity of the separate layers. Finally, and above all, the metal oxide must provide a good nucleation surface for the deposition of the metallic layer, so that a continuous metallic film can be deposited with minimum resistance and maximum transmittance. The characteristics of continuous and discontinuous silver films are described in U.S. Pat. No. 4,462,884 to Gillery et al the disclosure of which is incorporated herein by reference.

Of the metal oxide films in general use, zinc oxide and bismuth oxide are insufficiently durable, being soluble in both acid and alkaline agents, degraded by fingerprints, and destroyed in salt, sulfur dioxide and humidity tests. Indium oxide, preferably doped with tin, is more durable; however, indium sputters slowly and is relatively expensive. Tin oxide, which may be doped with indium or antimony, is also more durable, but does not provide a suitable surface for nucleation of the silver film, resulting in high resistance and low transmittance. The characteristics of a metal oxide film which result in proper nucleation of a subsequently deposited silver film have not been established; however, trial-and-error experimentation has been widely practiced with the metal oxides described above.

SUMMARY OF THE INVENTION

The present invention provides a novel film composition of an oxide of a metal alloy, as well as a novel multiple-layer film of metal and metal alloy oxide layers for use as a high transmittance, low emissivity coating.

DETAILED DESCRIPTION OF THE PREFERRED EMBODIMENTS

A novel film composition comprising an oxide of a metal alloy is preferably deposited by cathode sputtering, preferably magnetron sputtering. A cathode target is prepared comprising the desired ratio of metal alloy elements. The target is then sputtered in a reactive atmosphere, preferably containing oxygen in order to deposit a metal alloy oxide film on a surface of a substrate.

A preferred metal alloy oxide in accordance with the present invention is an oxide of an alloy comprising zinc and tin. A zinc/tin alloy oxide film may be deposited in accordance with the present invention by cathode sputtering, preferably magnetically enhanced. Cathode sputtering is also a preferred method for depositing high transmittance, low emissivity films in accordance with the present invention. Such films typically comprise multiple layers, preferably a layer of a highly reflective metal such as gold, silver or copper sandwiched between anti-reflective metal oxide layers such as indium oxide or titanium oxide. In accordance with the present invention, the anti-reflective metal oxide layer comprises an oxide of an alloy of zinc and tin, and preferably comprises zinc stannate. While the characteristics of a metal alloy oxide film cannot always be predicted with respect to its performance in combination with a metallic film layer to form a high transmittance, low emissivity coating, various tests may be performed to determine its durability and, more importantly, its effectiveness in regard to nucleation of a silver film.

For durability, there are heat tests which measure changes in transmittance, reflectance and color of the coating as an indication of long-term stability, accalerated weathering and exposure tests which measure the effects of such environmental conditions as ultraviolet radiation, humidity and salt (fingerprints or coastal environment); a sulfur dioxide test to determine the susceptibility of the coating to damage by acidic atmospheric pollutants, and a test to determine whether the coating is damaged by a conventional glass washer and acidic or alkaline detergents.

More importantly, a nucleation test may be performed to evaluate the effects of the metal alloy oxide on the deposition of a metallic layer such as silver. To perform the nucleation test, a layer of the metal alloy oxide is deposited on a substrate surface. A given weight of silver per unit area of substrate surface is then deposited over the silver. Finally, a second layer of metal alloy oxide is deposited over the silver layer. The first effect to be evaluated is the decrease in transmittance as the silver is deposited: the less the decrease in transmittance, the lower the absorption and the better the nucleation. The second effect is the surface resistance of the multiple layer coating: the lower the resistance, the better the nucleation. The third effect is the final transmittance of the multiple layer coating: the higher the transmittance, the better the nucleation.

While various metal alloys may be sputtered to form metal alloy oxide films, in order to produce a preferred high transmittance, low emissivity multiple layer film in accordance with the present invention, alloys of tin and zinc are preferred. A particularly preferred alloy comprises zinc and tin, preferably in proportions of 10 to 90 percent zinc and 90 to 10 percent tin. A preferred zinc/tin alloy ranges from 30 to 60 percent zinc, preferably having a zinc/tin ratio from 40:60 to 60:40. A most preferred range is 46:54 to 50:50 by weight tin to zinc. A cathode of zinc/tin alloy reactively sputtered in an oxidizing atmosphere results in the deposition of a metal oxide layer comprising zinc, tin and oxygen, preferably comprising zinc stannate, $Zn_2SnO_4$.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. At least one cathode target surface comprises a metal alloy such as zinc/tin which is sputtered in a reactive atmosphere to form a metal alloy oxide film. The anode is preferably a symmetrically designed and positioned assembly as taught in U.S. Pat. No. 4,478,702 by Gillery et al, the disclosure of which is incorporated herein by reference.

In a preferred embodiment of the present invention, a multiple layer film is deposited by cathode sputtering to form a high transmittance, low emissivity coating. In addition to the metal alloy target, at least one other cathode target surface comprises a metal to be sputtered to form a reflective metallic layer. A multiple layer coating having a reflective metallic layer in combination with an anti-reflective metal alloy oxide layer is produced as follows.

A clean glass substrate is placed in a coating chamber which is evacuated, preferably to less than $10^{-4}$ torr, more preferably less than $2 \times 10^{-5}$ torr. A selected atmosphere of inert and reactive gases, preferably argon and oxygen, is established in the chamber to a pressure between about $5 \times 10^{-4}$ and $10^{-2}$ torr. A cathode having a target surface of zinc/tin metal alloy is operated over the surface of the substrate to be coated. The target metal is sputtered, reacting with the atmosphere in the chamber to deposit a zinc/tin alloy oxide coating layer on the glass surface.

After the initial layer of zinc/tin alloy oxide is deposited, the coating chamber is evacuated, and an inert atmosphere such as pure argon is established at a pressure between about $5 \times 10^{-4}$ and $10^{-2}$ torr. A cathode having a target surface of silver metal is operated over the zinc/tin alloy oxide coated surface. The target metal is sputtered and deposits a reflective, conductive metallic layer on the zinc/tin alloy oxide coated glass surface. A second layer of zinc/tin alloy oxide is deposited on the silver layer under essentially the same conditions used to deposit the first zinc/tin alloy oxide layer.

The present invention will be further understood from the descriptions of specific examples which follow. In the examples, the zinc/tin alloy oxide film is referred to as zinc stannate although the film composition need not be precisely $Zn_2SnO_4$.

EXAMPLE I

A stationary cathode measuring 5 by 17 inches (12.7 by 43.2 centimeters) comprises a sputtering surface of zinc/tin alloy consisting of 52.4 weight percent zinc and 47.6 percent tin. A soda-lime-silica glass substrate is placed in the coating chamber which is evacuated to establish a pressure of 4 millitorr in an atmosphere of 50/50 argon/oxygen. The cathode is sputtered in a magnetic field at a power of 1.7 kilowatts while the glass is conveyed past the sputtering surface at a rate of 110 inches (2.8 meters) per minute. A film of zinc stannate is deposited on the glass surface. Three passes produce a film thickness of about 340 Angstroms, which results in a decrease in transmittance from 90 percent for the glass substrate to 81 percent for the zinc stannate coated glass substrate.

EXAMPLE II

A multiple layer film is deposited on a soda-lime silica glass substrate to produce a high transmittance, low emissivity coated product. First, a zinc stannate layer is deposited as in Example I. Second, a layer of silver is deposited over the zinc stannate by sputtering a silver cathode target in an atmosphere of argon gas at a Pressure of 4 millitorr. With the substrate passing the silver cathode target at the same rate as in Example I, two passes are performed in order to deposit eleven micrograms of silver per square centimeter, corresponding to a film thickness of about 90 Angstroms, which decreases the transmittance of the coated substrate from 81 percent with the first zinc stannate film to 72 percent. Preferably, the silver is coated with a layer of zinc/tin alloy to improve the adhesion and protect the silver layer before the final anti-reflective layer of zinc stannate is deposited. Since the metal alloy further decreases the transmittance, its thickness is preferably minimal. The metal layer is deposited by sputtering the zinc/tin alloy target at minimum power in argon at a pressure of 4 millitorr. The transmittance of the sample decreases to 60 percent after a single pass. Finally, the zinc/tin alloy cathode target is sputtered in an oxidizing atmosphere as in Example I to produce a zinc stannate film. Four passes at a rate of 110 inches (2.8 meters) per minute produce a film thickness of about 430 Angstroms, which increases the transmittance of the coating product from 60 to 87 percent. The final coated product has a surface resistance of 10 ohms per square and a slightly bluish reflectance from both sides, with a luminous reflectance of 5 percent from the coated side and 6 percent from the uncoated side.

The above examples are offered to illustrate the present invention. Various modifications of the product and the process are included. For example, other coating compositions are within the scope of the present invention. Depending on the proportions of zinc and tin when a zinc/tin alloy is sputtered, the coating may contain widely varying amounts of zinc oxide and tin oxide in addition to zinc stannate. Since the process does not require very high temperatures, substrates other than glass, such as various plastics, may be coated. A scanning cathode may be used with a stationary substrate, Process parameters such as pressure and concentration of gases may be varied over a broad range. The scope of the present invention is defined by the following claims.

I claim:

1. A high transmittance, low emissivity article comprising:
   a. a transparent nonmetallic substrate;
   b. a first transparent film comprising an oxide reaction product of a metal alloy comprising zinc and tin deposited on a surface of said substrate;
   c. a transparent metallic film deposited on said first metal alloy oxide film; and
   d. a second transparent film comprising an oxide reaction product of a metal alloy comprising zinc and tin deposited on said metallic film.
2. An article according to claim 1, wherein the substrate is glass.
3. An article according to claim 2, wherein the metallic film is silver.
4. An article according to claim 3, wherein the metal alloy consists essentially of zinc and tin.
5. An article according to claim 4, wherein the metal alloy comprises from about 10 to about 90 percent zinc.
6. An article according to claim 5, wherein the metal alloy comprises about 30 to 60 percent zinc.
7. An article according to claim 6, wherein the metal alloy comprises about 50 to 54 percent zinc.
8. An article according to claim 4, wherein the transparent film comprising an oxide reaction product of a metal alloy comprises zinc stannate.
9. An article according to claim 1, wherein a transparent metal-contining film is deposited between the transparent metallic film and the second trnsparent film comprising an oxide reaction product of a metal alloy.
10. An article according to claim 9, wherein the transparent metal-containing film comprises a metal alloy of zinc and tin.
11. A method for depositing a film comprising an oxide of a metal alloy comprising the steps of:
    a. forming a cathode target comprising a metal alloy of zinc and tin;
    b. placing a substrate to be coated in an evacuated chamber with said cathode target; and
    c. sputtering said metal alloy cathode target in a reactive atmosphere comprising oxygen thereby depositing a metal alloy oxide film on a surface of said substrate.
12. A method according to claim 11, wherein said sputtering is magnetically enhanced.
13. A method according to claim 12, wherein said substrate is glass.
14. A method according to claim 13, wherein said metal alloy consists essentially of zinc and tin.
15. A method according to claim 14, wherein said film comprises zinc stannate.
16. A method for making a multiple layer high transmittance, low emissivity coated product comprising the steps of:
    a. placing a transparent, nonmetallic substrate in a sputtering chamber;
    b. sputtering a cathode target comprising an alloy of zinc and tin in a reactive atmosphere comprising oxygen to deposit a transparent metal alloy oxide film on a surface of said substrate;
    c. sputtering a silver cathode target, in an inert atmosphere to deposit a transparent silver film on said metal alloy oxide film; and
    d. sputtering a cathode target comprising an alloy of zinc and tin in a reactive atmosphere comprising oxygen to deposit a metal alloy oxide film on said silver film.

17. The method according to claim 16, wherein the substrate is glass.

18. The method according to claim 17, wherein said metal alloy consists essentially of zinc and tin.

19. The method according to claim 18, wherein said metal alloy oxide film comprises zinc stannate.

20. The method according to claim 16, which further comprises the step of depositing a transparent metal alloy film between said silver film and said metal alloy oxide film.

* * * * *